(12) United States Patent
Bian et al.

(10) Patent No.: US 6,413,608 B1
(45) Date of Patent: Jul. 2, 2002

(54) SEED LAYER AND UNDERLAYER WITH HIGH AND LOW OXYGEN CONCENTRATION PORTIONS FOR HAND DISK MAGNETIC RECORDING MEDIUM ON A GLASS SUBSTRATE

(75) Inventors: Xiaoping Bian, San Jose; Mary Frances Doerner, Santa Cruz; Shanlin Duan, Fremont; Jinshan Li; Mohammad Taghi Mirzamaani, both of San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/336,641

(22) Filed: Jun. 18, 1999

(51) Int. Cl.⁷ .............................. G11B 5/66; G11B 5/70; G11B 5/82; B32B 3/02; B32B 7/02
(52) U.S. Cl. ................. 428/65.7; 428/694 TS; 428/212; 428/336; 428/900; 360/135
(58) Field of Search .............. 428/694 TS, 694 T, 428/900, 65.7, 212, 336; 360/86, 135

(56) References Cited

U.S. PATENT DOCUMENTS

| | | | |
|---|---|---|---|
| 4,661,418 A | 4/1987 | Yanai et al. | 428/610 |
| 4,833,020 A | 5/1989 | Shiroishi et al. | 428/336 |
| 4,855,175 A | 8/1989 | Wakai et al. | 428/148 |
| 4,900,397 A | 2/1990 | Werner et al. | 156/643 |
| 5,066,552 A | 11/1991 | Howard et al. | 428/694 |
| 5,232,566 A | 8/1993 | Edmonson et al. | 204/192.1 |
| 5,316,631 A | 5/1994 | Ando et al. | 204/192.2 |
| 5,456,978 A | 10/1995 | Lal et al. | 428/332 |
| 5,587,235 A | 12/1996 | Suzuki et al. | 428/332 |
| 5,721,033 A | 2/1998 | Teng et al. | 428/65.3 |
| 6,156,422 A | * 12/2000 | Wu et al. | 428/332 |
| 6,174,582 B1 | * 1/2001 | Bian et al. | 428/65.3 |

* cited by examiner

*Primary Examiner*—Paul Thibodeau
*Assistant Examiner*—Holly C. Rickman
(74) *Attorney, Agent, or Firm*—Robert O. Guillot; Intellectual Property Law Offices

(57) ABSTRACT

The thin film magnetic disk of the present invention includes a non-metallic substrate having a seed layer deposited on the substrate, an underlayer deposited upon the seed layer composed of a chromium alloy having a relatively high oxygen concentration portion of from 2,000 ppm to 20,000 ppm and preferably approximately 4,000 ppm to 12,000 ppm, followed by a relatively low oxygen concentration portion of from 0–2,000 ppm, and preferably from 500 ppm to 1,500 ppm and a magnetic layer that is deposited upon the underlayer. The underlayer total thickness is in the range of from approximately 250 Å to approximately 700 Å with a preferred thickness of approximately 450 Å, wherein approximately half of the underlayer thickness is the high oxygen concentration portion and half is the low oxygen concentration portion.

18 Claims, 2 Drawing Sheets

SEED LAYER AND UNDERLAYER WITH HIGH AND LOW OXYGEN CONCENTRATION PORTIONS FOR HAND DISK MAGNETIC RECORDING MEDIUM ON A GLASS SUBSTRATE

BACKGROUND OF THE INVENTION

1. Field of the Invention

The present invention relates generally to the fabrication of glass substrate magnetic recording hard disks, and more particularly to the use of a NiAl seed layer, together with a two part chromium underlayer having a high oxygen concentration portion and a low oxygen concentration portion for depositing the magnetic layer thereon.

2. Description of the Prior Art

The magnetic recording disk in a conventional hard disk drive assembly typically includes a substrate, an underlayer consisting of a thin film of chromium (Cr) or a Cr alloy, a cobalt-based magnetic alloy layer deposited on the underlayer, and a protective overcoat over the magnetic layer. A variety of disk substrates such as NiP-coated AlMg, glass, glass ceramic, glassy carbon, etc., have been used. The microstructural parameters of the magnetic layer, i.e., crystallographic preferred orientation (PO), grain size and magnetic exchange decoupling between the grains, play key roles in controlling the recording characteristics of the disk. The underlayer is mainly used to control such microstructural parameters as the PO and grain size of the cobalt-based magnetic alloy layer. The PO of the various materials forming the layers on the disk is not necessarily an exclusive orientation which may be found in the material, but is merely the dominant orientation. The use of Cr as an underlayer on metallic substrates, such as NiP coated AlMg, typically results in a $11\bar{2}0$ PO for the magnetic alloy layer. However, since nucleation and growth of Cr or Cr alloy underlayers on glass and most non-metallic substrates differ significantly from those on NiP-coated AlMg substrates, media fabricated on glass substrates often have larger noise compared with those made on NiP-coated AlMg substrates under identical deposition conditions. It is for this reason that the use of an initial layer on the glass substrate (called the seed layer) is necessary. The seed layer is formed between the glass substrate and the underlayer in order to control nucleation and growth of the underlayer, which in turn affects the magnetic layer. Several materials have been proposed for seed layers on glass and non-metallic substrates, such as: Al, Cr, CrNi, Ti, $Ni_3P$, MgO, Ta, C, W, Zr, AlN and NiAl. (See for example, "Seed Layer induced (002) crystallographic texture in NiAl underlayers," Lee, et al., J. Appl. Phys, Vol. 79(8), p.4902ff, Apr. 15, 1996). A glass substrate having a NiAl seed layer and low oxygen Cr underlayer is described by L. Lee et al., IEEE Trans. Magnetic, Vol. 30, Page 3957 (1994). In a glass substrate disk, Laughlin, et al., have described use of an NiAl seed layer followed by a 2.5 nm thick Cr underlayer and a CoCrPt magnetic layer. The NiAl seed layer with the Cr underlayer was said to induce the $10\bar{1}0$ PO in the magnetic layer. (See "The control and Characterization of the Crystallographic Texture of Longitudinal Thin Film Recording Media, IEEE Trans. Magnetic, Vol. 32(5), Page 3632, September 1996).

The improvement in signal to noise ratio (SNR) of the thin film disk media while maintaining a high coercivity remains as one of the major challenges in high density recording technology. A variety of approaches such as choosing a low noise alloy, designing an appropriate underlayer, tailoring of the deposition parameters, and lamination of the magnetic layer have been suggested to reduce the media noise. A chromium underlayer with a high oxygen concentration is known to increase the SNR over a low oxygen concentration underlayer, but the coercivity of the magnetic layer is reduced. In the present invention, an improvement in the underlayer is presented by the controlled introduction of oxygen into the Cr underlayer to create a high oxygen concentration portion followed by a low oxygen concentration portion. As is described hereinbelow, the dual level oxygen concentration Cr underlayer of the present invention both increases SNR and increases the coercivity of the magnetic layer. Thus, control of the oxygen concentration in the Cr underlayer provides control of the magnetic layer coercivity and its SNR.

SUMMARY OF THE INVENTION

The thin film magnetic disk of the present invention includes a non-metallic substrate having a seed layer deposited on the substrate, an underlayer deposited upon the seed layer composed of a chromium compound having a relatively high oxygen concentration portion followed by a relatively low oxygen concentration portion, and a magnetic layer that is deposited upon the underlayer. An overcoat is typically, although not necessarily deposited upon the magnetic layer. In the preferred embodiment, the substrate is composed of glass, the seed layer is composed of NiAl, the chromium compound is chromium and the magnetic layer is composed of a cobalt alloy. The underlayer preferably has a high oxygen concentration portion of from 2,000 ppm to 20,000 ppm and preferably approximately 4,000 ppm to 12,000 ppm, and a low oxygen concentration portion of from 0–2,000 ppm, and preferably from 500 ppm to 1,500 ppm. The underlayer total thickness is in the range of from approximately 250 Å to approximately 700 Å with a preferred thickness of approximately 450 Å, wherein approximately half of the underlayer thickness is the high oxygen concentration portion and half is the low oxygen concentration portion. The method for manufacturing the present invention utilizes standard thin film deposition techniques, and the underlayer is preferably formed utilizing a target having both chromium and oxygen as target components. In the present invention, the coercivity of the magnetic layer is controlled by adjusting the thickness and oxygen concentration of the underlayer. The coercivity generally decreases with increasing oxygen concentration of the underlayer and increases with increasing thickness of the underlayer. A disk drive of the present invention includes at least one thin film magnetic disk coupled to the spindle of the disk drive.

It is an advantage of the present invention that an improved thin film magnetic disk is provided.

It is a further advantage of the thin film magnetic disk of the present invention that it has a chromium underlayer having a relatively high oxygen concentration portion and a relatively low oxygen concentration portion, which provides improved SNR and coercivity to the magnetic layer of the disk.

It is yet another advantage of the thin film magnetic disk of the present invention that it is manufactured utilizing a process in which the coercivity of the magnetic layer on the disk can be controlled.

It is an advantage of the method of manufacturing the thin film magnetic disk of the present invention that it includes a chromium underlayer with a relatively high oxygen concentration portion and a relatively low oxygen concentration portion that is formed utilizing two targets containing chromium with controlled concentrations of oxygen.

It is another advantage of the method of manufacturing the thin film magnetic disk of the present invention that control over the SNR and coercivity of the magnetic layer is achieved.

These and other features and advantages of the present invention will become known to those skilled in the art upon reviewing the following detailed description which makes reference to the several figures of the drawing.

IN THE DRAWINGS

DETAILED DESCRIPTION OF THE PREFERRED EMBODIMENTS

Figure 1:
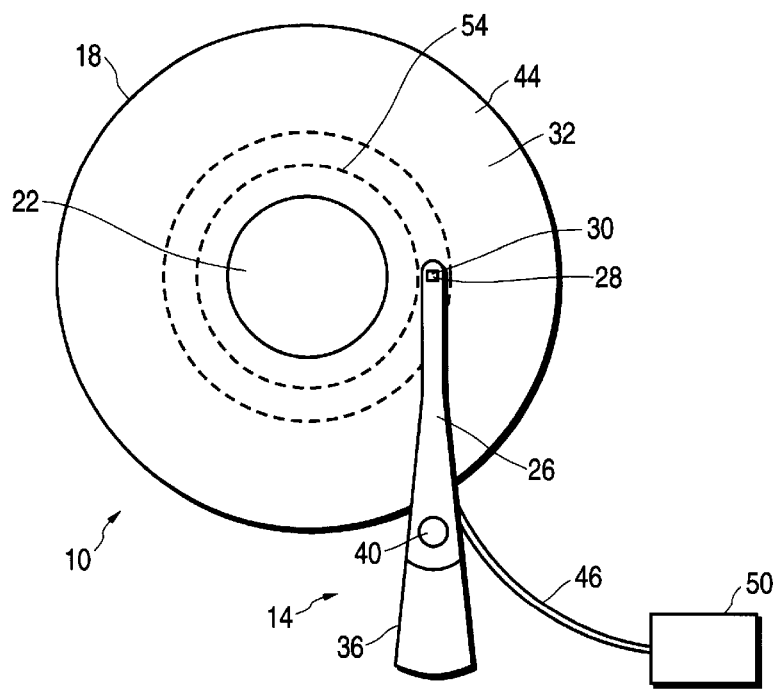
FIG. 1 is a top plan view of a hard disk drive including a disk of the present invention.

FIG. 1 is a top plan view illustrating a standard disk drive system 10 with a rotary actuator assembly 14 and at least one hard disk 18 of the present invention. The disks 18 are mounted on spindle 22 which is rotated by an in-hub electrical motor (not shown), and an actuator 26 supports a slider 28 which contains one or more read/write heads 30. The assembly 14 may be composed of a plurality of disks 18, actuators 26 and sliders 28 arranged in a vertical stack. A voice coil motor (VCM) 36 moves the actuator assembly 14 relative to the disks 18 by causing the assembly to pivot around shaft 40. The heads 30 are typically contained in air bearing sliders 28 adapted for flying above the surface 32 of the disks 18 when rotating at sufficient speed. In operation, when the sliders 28 are flying above the disks 18 the VCM 36 moves the sliders 28 in an arcuate path across the disks allowing the heads 30 to be positioned to read and write magnetic information from circular tracks formed in the data area 44 which is coated with the thin films which will be described in more detail below. Electrical signals to and from the heads and the VCM are carried by a flex cable 46 to the drive electronics 50. When not operating and during periods when the rotation of the disks is either starting or stopping, the sliders 28 may be positioned in physical contact with the surface of the disks in a landing zone or contact start/stop (CSS) area 54 which is not used for data storage even though the magnetic coating extends over this area; alternatively the sliders are removed from the disk surface using a unload ramp (not shown). Although the disk drive 10 has been described with air bearing sliders, the disk 18 of the present invention may easily be used in other storage devices having near contact, or contact recording sliders.

Figure 2:
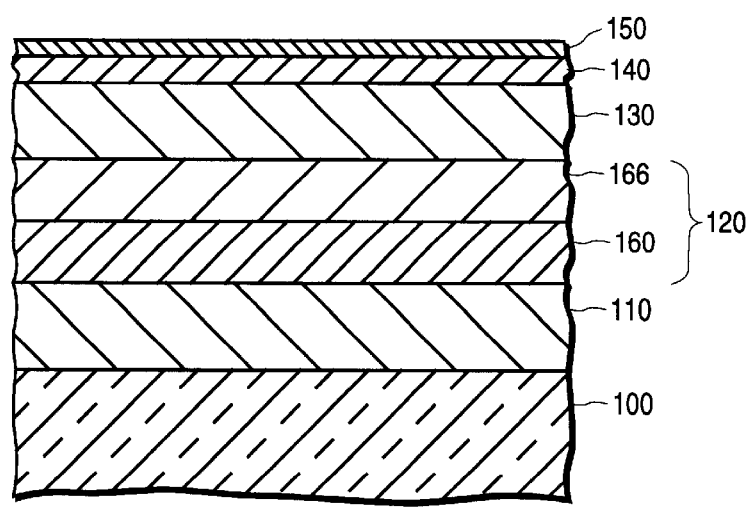
FIG. 2 is a side elevational view depicting the layered structure of the hard disk of the present invention.

FIG. 2 illustrates the cross-sectional layer structure of an embodiment of a thin film magnetic disk 18 according to the invention. The thin film layers are deposited onto at least one and preferably both planar surfaces of the disk 18 to form the data recording area. The basic layers of the disk 18 are a substrate layer 100, a seed layer 110, an underlayer 120, a magnetic media layer 130, an overlayer 140, and a top lubricant layer 150. The substrate layer 100 is generally non-metallic and in the preferred embodiment is made of glass. The seed layer 110 is a B2 structure material which is deposited directly onto the glass substrate 100 and is preferably composed of NiAl. The B2 structure is an ordered cubic structure that can be described as two interpenetrating simple cubic lattices where Al atoms occupy one lattice and Ni atoms the other. NiAl has a lattice constant which is nearly identical to that of Cr, but NiAl tends to form smaller grain size due to the bonding between the Ni and Al atoms which reduces atomic mobility during deposition.

In the present invention, the underlayer 120 is deposited onto the seed layer and is composed of a chromium alloy with a high oxygen concentration portion 160, topped by a low oxygen concentration portion 166. In the preferred embodiment the underlayer is composed of chromium and the high oxygen concentration of the underlayer portion 160 is generally in range of preferably 2,000–20,000 parts per million (ppm), and preferably in the range of 4,000–12,000 ppm. The low oxygen concentration portion 166 of the underlayer 120 is generally in the range of 0–2,000 ppm, and preferably in the range of 500–1,500 ppm. This low oxygen concentration underlayer portion 166 results in improved coercivity of the magnetic layer 130 deposited thereon. The thickness of the underlayer 120 is preferably within the range of approximately 250 Å to 700 Å, with approximately half the thickness being applied to each portion 160 and 166. As described herebelow, the SNR and coercivity of the magnetic layer 130 can be controlled by controlling the oxygen content and thickness of the underlayer 120.

The magnetic layer 130 preferably is an alloy of cobalt which typically contains platinum and chromium and may contain additional elements such as tantalum or boron, e.g. CoPtCrTa or CoPtCrB. A typical magnetic layer might comprise 4 to 14 at. % platinum, 18 to 23 at. % chromium and 1 to 5 at. % tantalum with the rest being Co. The optional overcoat layer 140 can be carbon, hydrogenated carbon or any other protective material. It is also known in the art to use additional layers between the magnetic layer and the overcoat to enhance the adhesion of the overcoat, improve hardness, etc. A top lubricant layer 150 is typically applied thereafter. The various layers are preferably sputter deposited using standard techniques, temperatures and pressures as are known to those skilled in the art.

A comparison of prior art disk (b) with an alternative disk (a) and the present invention disk (c) is presented in Table 1 herebelow. The prior art disk (b) comprises a glass substrate, a NiAl seed layer, a low-oxygen Cr underlayer (less than approximately 500 ppm), and a Co based magnetic layer, as is described in L. Lee et al., IEEE Trans. Magnetic, Vol 30, P. 3951 (1994). The alternative disk (a) comprises a glass substrate, a NiAl seed layer, a high-oxygen content Cr underlayer (approximately 10,000 ppm) and a Co based magnetic layer.

TABLE 1

| Disk | Seed Layer | Underlayer | SNR (dB) | Coercivity (Hc(Oe)) |
|---|---|---|---|---|
| a | NiAl | Cr (10,000 ppm Oxygen) | 32.6 | 2850 |
| b | NiAl | Cr (500 ppm Oxygen) | 29.9 | 3500 |
| c | NiAl | Dual Cr (high 10,000 ppm/ low 500 ppm oxygen | 32.4 | 3200 |

As can be understood from Table 1, the single high oxygen underlayer of disk (a) significantly improves the SNR over the low oxygen concentration underlayer of disk (b), but coercivity is greatly reduced. The dual oxygen concentration Cr underlayer of disk (c) achieves increased coercivity while maintaining the excellent SNR, thus demonstrating the improved quality of the dual oxygen concentration underlayer of disk (c) of the present invention.

Figure 3:
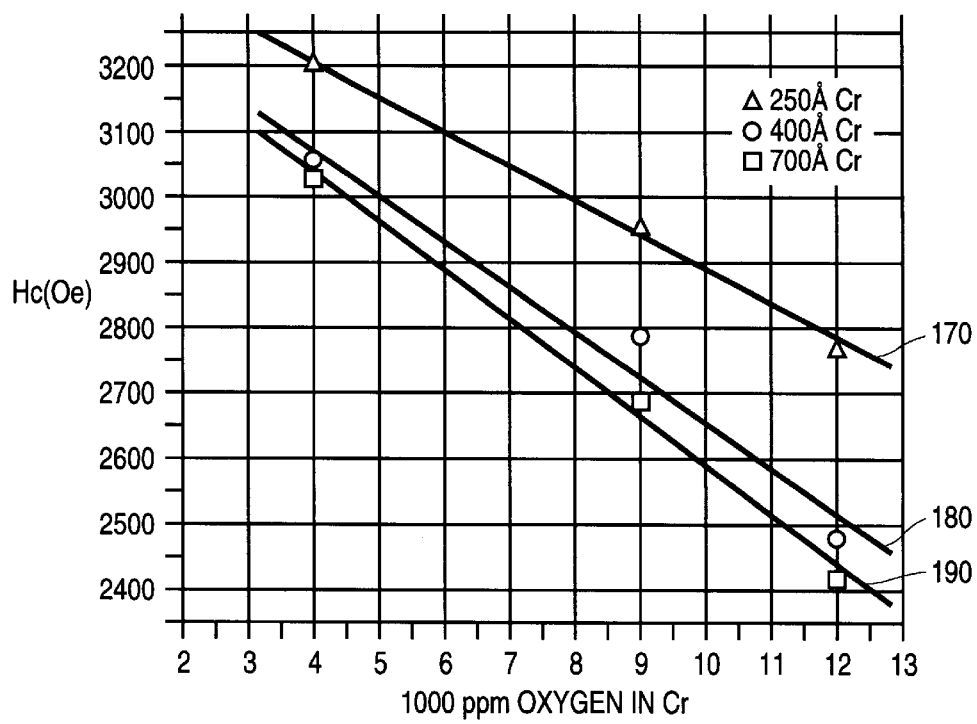
FIG. 3 is a graph depicting the relationship between the coercivity of the magnetic media and the oxygen concentrations in the underlayer.

An effect of the oxygen concentration in the Cr underlayer is a change in coercivity in the magnetic layer deposited thereon. FIG. 3 is a graphical depiction of the relationship between magnetic coercivity and Cr underlayer oxygen content for varying underlayer thicknesses of 250 Å (lower line 170), 400 Å (middle line 180), and 700 Å (upper line 190) for a single layer underlayer. As depicted therein, the coercivity Hc(Oe) of the magnetic layer 130 increases in a somewhat generally linear manner with a decrease in the underlayer oxygen concentration. Additionally, the coercivity of the magnetic layer 130 increases as the thickness of the underlayer increases. Thus, the coercivity of the magnetic layer can be controlled by controlling the oxygen content of the Cr underlayer, and is understood by those skilled in the art, the ability to control the coercivity of the magnetic layer provides a significant advantage in the manufacturing of hard disks.

Figure 4:
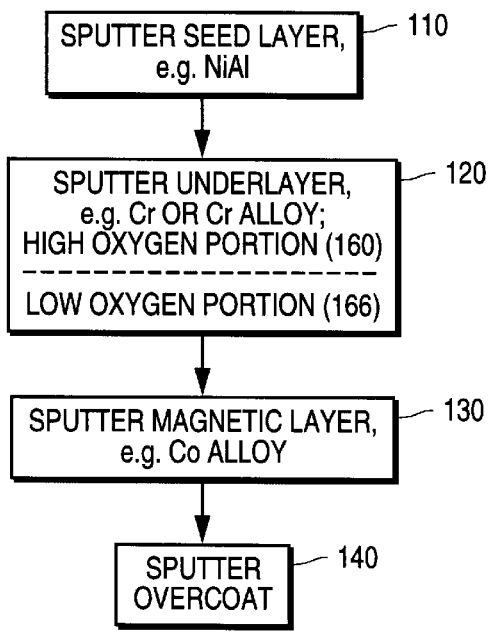
FIG. 4 is a flow chart depicting a method for making hard disks according to the present invention.

FIG. 4 is a flow chart of the steps for one method of making a disk according to the present invention. All of the layers from the seed layer to the overcoat can be sputtered in a continuous process in either an in-line sputtering system or a single disk sputter system, and current commercial in-line sputtering systems may be equipped with additional targets and/or multiple-pass capabilities to fabricate laminated disk structures. Starting with a glass substrate 100, the layers are sequentially sputter deposited as indicated in FIG. 3. The seed layer 110 is deposited first, followed by the underlayer 120, in high oxygen concentration portion 160 and then a low oxygen concentration portion 166, then the magnetic layer 130, then the optional further last steps deposit a protective overcoat 140 and a lubricant layer 150. The preferred method for depositing the high and low oxygen concentration Cr underlayer portion is to utilize two different Cr alloy sputtering targets containing the desired oxygen concentrations.

The relative thicknesses of the layers are important for practicing the invention, and the following ranges are given as guidance. The seed layer 110 is preferably from 20 to 50 nm thick. The underlayer is typically thicker than the seed layer, and the thickness range of the underlayer is 250 Å to 700 Å, with approximately half the thickness being the high oxygen concentration portion 160 and half the thickness being the low oxygen concentration portion 166. A high oxygen concentration underlayer portion 160 in the range of 2,000–20,000 ppm and preferably 4,000 ppm to 10,000 ppm, together with a low oxygen concentration underlayer portion 166 in the range of 0–2,000 ppm and preferably 500 ppm to 15,000 ppm, are utilized to produce the improved results in the magnetic characteristics of the disk; that is, both SNR and coercivity. A typical value for the thickness of the underlayer 120 is 450 Å with a high oxygen concentration portion 160 of approximately 10,000 ppm and a low oxygen concentration portion 166 of approximately 500 ppm. The magnetic layer 130 can be from 5–50 nm thick with 30 nm being typical. The use, composition and thickness of the overcoat 140 are not critical in practicing the invention, but a typical thin film disk might use an overcoat less than 15 nm thick.

While the preferred embodiments of the present invention have been illustrated in detail, it will be apparent to the one skilled in the art that alternative embodiments of the invention are realizable without deviating from the scope and spirit of the invention.

What we claim is:

1. A thin film magnetic disk comprising:
   a non-metallic substrate;
   a seed layer deposited onto said substrate;
   an underlayer deposited upon said seed layer,
   said underlayer including a chromium oxygen compound and having a first portion and a second portion wherein said underlayer has chromium and oxygen throughout the thickness thereof;
   said first portion being disposed upon said seed layer and having an oxygen concentration in the range of from approximately 2,000 ppm to approximately 20,000 ppm;
   said second portion being disposed upon said first portion, and having an oxygen concentration in the range of from approximately 500 ppm to approximately 1,500 ppm;
   wherein the total thickness of said underlayer is from approximately 250 Å to approximately 700 Å;
   a magnetic layer being deposited upon said second portion of said underlayer.

2. A disk as described in claim 1 wherein said oxygen concentration of said first portion is within the range of from approximately 4,000 ppm to approximately 12,000 ppm.

3. A disk as described in claim 2 wherein said oxygen concentration of said first portion is approximately 10,000 ppm.

4. A disk as described in claim 1 wherein approximately half said underlayer thickness comprises said first portion, and approximately half said underlayer thickness comprises said second portion.

5. A disk as described in claim 4 wherein said underlayer has a thickness of approximately 450 Å.

6. A disk as described in claim 1 wherein said seed layer comprises NiAl and said magnetic layer is composed of a cobalt alloy.

7. A disk as described in claim 1 wherein said oxygen concentration of said second portion is approximately 500 ppm.

8. A disk as described in claim 1 wherein said substrate is comprised of glass, said seed layer is comprised of NiAl, and wherein said first portion of said underlayer has an oxygen concentration in the range of from approximately 4,000 ppm to approximately 12,000 ppm.

9. A disk as described in claim 8 wherein said oxygen concentration of said first portion is approximately 10,000 ppm, and said oxygen concentration of said second portion is approximately 500 ppm.

10. A disk as described in claim 8 wherein said underlayer has a thickness in the range of from approximately 250 Å to approximately 700 Å, and wherein approximately half said underlayer thickness comprises said first portion, and approximately half said underlayer thickness comprises said second portion.

11. A disk as described in claim 10 wherein said underlayer thickness is approximately 450 Å.

12. A disk as described in claim 8 wherein said substrate has two planar sides, and wherein a seed layer, an underlayer and a magnetic layer are formed on each side.

13. A disk drive comprising:
    a motor for rotating a spindle;
    at least one thin film magnetic disk coupled to said spindle, said disk including a non-metallic substrate, a seed layer deposited upon said substrate, an underlayer deposited upon said seed layer,
    said underlayer including a chromium oxygen compound and having a first portion and a second portion wherein said underlayer has chromium and oxygen throughout the thickness thereof;
    said first portion being disposed upon said seed layer and having an oxygen concentration in the range of from approximately 2,000 ppm to approximately 20,000 ppm;

said second portion being disposed upon said first portion, and having an oxygen concentration in the range of from approximately 500 ppm to approximately 15,000 ppm;

wherein the total thickness of said underlayer is from approximately 250 Å to approximately 700 Å, and a magnetic layer deposited upon said second underlayer portion; and an actuator assembly including a head for writing magnetic information on the disk as it rotates.

14. A disk drive as described in claim 13 wherein:

said substrate is composed of glass;

said seed layer is composed of NiAl; and said magnetic layer is composed of a cobalt based composition.

15. A disk drive as described in claim 14 wherein said oxygen concentration of said first portion is within the range of from approximately 4,000 ppm to approximately 12,000 ppm.

16. A disk drive as described in claim 15 wherein said oxygen concentration of said first portion is approximately 10,000 ppm, and said oxygen concentration of said second portion is approximately 500 ppm.

17. A disk drive as described in claim 13 wherein approximately half said underlayer thickness comprises said first portion, and approximately half said underlayer thickness comprises said second portion.

18. A disk drive as described in claim 17 wherein said underlayer thickness is approximately 450 Å.

* * * * *